US008048485B2

(12) United States Patent
Shatwell

(10) Patent No.: US 8,048,485 B2
(45) Date of Patent: Nov. 1, 2011

(54) METHOD AND APPARATUS FOR THE PRODUCTION OF CARBON NANOSTRUCTURES

(75) Inventor: Robert Alan Shatwell, Farnborough (GB)

(73) Assignee: Qinetiq Limited (GB)

( * ) Notice: Subject to any disclaimer, the term of this patent is extended or adjusted under 35 U.S.C. 154(b) by 2398 days.

(21) Appl. No.: 10/504,204

(22) PCT Filed: Feb. 17, 2003

(86) PCT No.: PCT/GB03/00674
§ 371 (c)(1),
(2), (4) Date: Aug. 11, 2004

(87) PCT Pub. No.: WO03/072497
PCT Pub. Date: Sep. 4, 2003

(65) Prior Publication Data
US 2005/0152826 A1 Jul. 14, 2005

(30) Foreign Application Priority Data
Feb. 28, 2002 (GB) .................................. 0204643.1

(51) Int. Cl.
*C23C 16/00* (2006.01)
(52) U.S. Cl. ............. 427/249.1; 427/249.3; 427/249.11; 427/251; 977/742
(58) Field of Classification Search ............... 427/249.1, 427/249.3, 249.11, 251; 977/742
See application file for complete search history.

(56) References Cited

U.S. PATENT DOCUMENTS

| 5,011,566 | A |   | 4/1991  | Hoffman                       |
|-----------|---|---|---------|-------------------------------|
| 5,296,011 | A |   | 3/1994  | Aikawa et al.                 |
| 5,510,098 | A |   | 4/1996  | Chow                          |
| 5,514,453 | A |   | 5/1996  | Goujard et al.                |
| 5,571,561 | A | * | 11/1996 | LePetitcorps et al. ..... 427/249.3 |
| 5,985,232 | A |   | 11/1999 | Howard et al.                 |
| 6,037,016 | A |   | 3/2000  | Devlin et al.                 |
| 6,044,792 | A |   | 4/2000  | Ogawa et al.                  |
| 6,051,152 | A |   | 4/2000  | Natishan et al.               |
| 6,413,487 | B1| * | 7/2002  | Resasco et al. ............ 423/447.3 |

FOREIGN PATENT DOCUMENTS

| CA | 2082775   | 2/2003 |
|----|-----------|--------|
| DE | 43 35 573 | 4/1995 |
| DE | 4335573   | 4/1995 |
| EP | 0 466 360 | 1/1992 |

(Continued)

OTHER PUBLICATIONS

Tanemura, et al., "Growth of Aligned Carbon Nanotubes by Plasma-Enhanced Chemical Vapor Deposition: Optimization of Growth Parameters", Jour. of Applied Physics, pp. 1529-1533.

(Continued)

*Primary Examiner* — Binh X Tran
(74) *Attorney, Agent, or Firm* — McDonnell Boehnen Hulbert & Berghoff LLP

(57) ABSTRACT

A method and apparatus for the continuous production of carbon nanostructures so as to improve their quality and quantity. Such structures have potential application as hydrogen storage means in new energy sources. The carbon nanostructures (20) are grown in a continuous or semi-continuous manner on a continuous, elongate, heated substrate (15) to form a coated substrate the process involving movement of the substrate through one or more deposition chambers (2,3). The substrate may be an electrically heated wire (15).

16 Claims, 5 Drawing Sheets

FOREIGN PATENT DOCUMENTS

| EP | 0 598 491 | 10/1993 |
| EP | 0 665 187 | 8/1995 |
| EP | 1 129 990 | 9/2001 |
| EP | 1 149 932 | 10/2001 |

OTHER PUBLICATIONS

Noury, et al. "Growth of Carbon Nanotubes on Cylindrical Wires by Thermal Chemical Vapor Deposition", Chemical Physics Letters, pp. 349-355 (2001).

Chen, et al., "Preparation and Characterization of Carbon Nanotubes Encapsulated GaN Nanowires", Jour. of Physics and Chemistry of Solids, pp. 1577-1586 (2001).

Merkulov et al., "Effects of Spatial Separation on the Growth of Vertically Aligned Carbon Nanofibers Produced by Plasma-Enhanced Chemical Vapor Deposition", Appl. Physics Ltr.

Bower, et al. "Plasma-Induced Alginment of Carbon Nanotubes", Applied Physics Letters, pp. 830-832 (2000).

\* cited by examiner

Fig. 1a
Fig. 1b
Fig. 1c
Figure 2
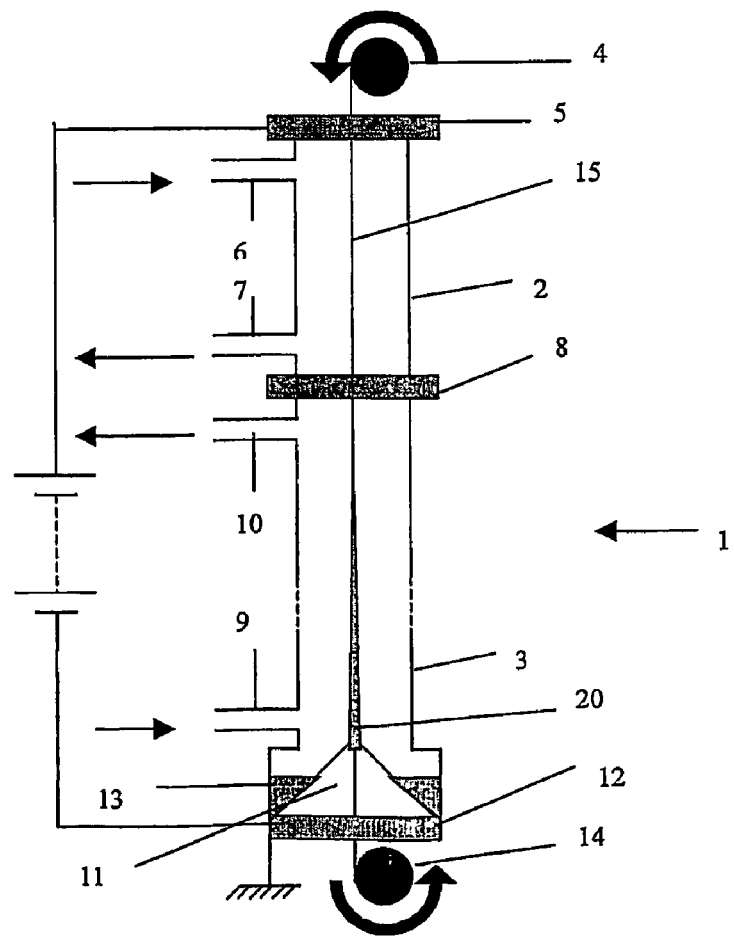

METHOD AND APPARATUS FOR THE PRODUCTION OF CARBON NANOSTRUCTURES

The present invention relates to a method and apparatus for the production of carbon nanostructures, also known as "nanocarbons". Such structures may have, for example, dimensions in the order of a few nanometers to a few hundred nanometers.

In recent years there has been increasing interest in carbon nanostructures because of their possible use for hydrogen storage, and hence their potential application in next generation fuel cells, etc. In 1996, carbon nanostructures were reported to be capable of storing in excess of 50 wt % of hydrogen at room temperature and 120 bar pressure.

Carbon nanostructures may take a number of forms, including single-wall carbon nanotubes (SWNTs), multi-wall carbon nanotubes (MWNTs), and carbon nanostacks or graphite nanofibres (GNFs). (The term "graphite" is used loosely here.) These different forms are respectively illustrated in FIGS. 1a to 1c below. SWNTs are essentially cylindrical forms of graphite, whose walls are one atom thick, while MWNTs are concentric collections of SWNTs. These tubular forms of carbon can have caps of carbon atoms on the end or be uncapped, and may be filled with other compounds. In GNFs, the graphene planes (one atom thick layers of graphitic carbon) are stacked on top of each other in either a planar or herring-bone configuration, the latter being thought to represent a cross-section through the actual structure comprising a stack of conical graphene sheets. In GNFs, hydrogen is thought to adsorb interstitially between the graphene planes.

The structures in FIG. 1 are all shown with catalyst particles associated with the carbon. Usually, the catalyst will be selected to have comparable dimensions to the resulting tube diameters. The three main prior art methods of fabrication, namely, electric arc, laser ablation or vapour grown deposition, usually rely on the presence of metal powder catalyst, such as iron, cobalt or nickel, on which the carbon atoms combine to form nanostructures. Growth occurs in the vicinity of the substrate in an ordered manner, with the growth plane disposed within the substrate surface, and it is usually desirable for the diameter, length, and sometimes the alignment of the tubes and stacks to be controlled. The resulting nanotubes may contain significant amounts of the metal particles, which may require removal, for example, by acid washing. Depending on the prior art method used, other forms of carbon such as pure graphite may also be produced, and further purification steps may be needed to increase the yield of pure carbon nanotubes, increasing the time and cost of manufacture.

EP-A-1 129 990 describes a plasma-enhanced chemical vapour deposition (PECVD) process for growing carbon nanotubes on catalytic metal substrates where the catalytic metal film preferably has a thickness of 0.5 to 200 nm, and is described as forming "islands" to promote nanotube growth. It teaches that a higher growth rate may be achieved using PECVD as opposed to thermal CVD, and by treating multiple batches of samples.

The above prior art methods are, however, batch processes, and do not facilitate the continuous production of carbon nanotubes in large amounts.

A significant problem encountered in attempting to use nanocarbons for hydrogen storage is their reproducibility. Widely varying reports as to their hydrogen uptake capability may be due to a lack of control of the quality and quantity of nanocarbons produced.

EP-A-0 665 187 discloses a method for the preparation of carbon nanotubes, wherein an axially extending carbonaceous anode rod is successively repositioned relative to a cathode surface while impressing a direct current therebetween. An arc discharge occurs with the simultaneous formation of carbon nanotubes on the exposed portions of the cathode surface, and the carbonaceous deposits are then scraped and collected. This method is stated to be susceptible to continuous operation, although this would be dependent upon the longevity of the anode and the re-usability of the cathode surface.

In a first aspect of the present invention there is provided a process for growing carbon nanostructures, in which the nanostructures are grown on a continuous, elongate, heated catalytic substrate using chemical vapour deposition to form a coated substrate.

Carbon nanostructures or "nanocarbons" are discrete, ordered structures grown from specific catalytic sites on a substrate and include carbon nanotubes, nanostacks, nanofibres and the like, which group of structures grow axially along their respective lengths away from the substrate surface. The carbon nanotubes, which may be single wall or multi-wall carbon nanotubes, and carbon nanostacks or graphite nanofibres, may have dimensions, for example, of from 1 nm to 500 nm wide and 1 µm to several mm long.

By "chemical vapour deposition" it is meant that a catalytic substrate is exposed to a gas that undergoes a chemical reaction to form a coating on the substrate; the coating may be formed where the gases impinge on the catalytic substrate or elsewhere, assisted by diffusion of atoms through the catalyst. In this case, the gas is a carbon bearing gas, with the result that a non-carbon substrate may be used. The process need not be plasma-assisted, and hence has the advantage that it may be conducted at atmospheric pressure.

The above process facilitates the production of nanocarbons in large amounts, and improves reproducibility. In the present process, the nanocarbons are removed from the substrates; by contrast, CVD processes are typically used to generate fully dense protective coatings on substrates, with the coating and substrate forming an integral product.

The process may involve movement of the elongate substrate through one or more deposition chambers. The substrate may move in one direction along its own length so that it moves into and/or out of the chamber, before and/or after deposition, or so it progresses through the deposition chamber at a desired speed during deposition.

Ideally, the nanocarbons are grown in a continuous or semi-continuous manner. Continuous operation where the substrate moves continually through the deposition chamber is preferred. In contrast to prior art batch operations, large amounts of nanostructures may therefore be produced, and with increased uniformity, leading to high reproducibilty. Semi-continuous operation, where, for example, the substrate moves incrementally at regular intervals, or where a new length of substrate is introduced into the elongate chamber, is subjected to deposition whilst stationary, and is then moved out as a new length is introduced, is also envisaged and will achieve similar advantages.

The continuous, elongate substrate may be in the form of a filament, wire, ribbon, tape or like element and may inherently act as a catalytic substrate without an additional catalytic film, coating, or the like. A metallic filament or wire of constant circular cross-section, preferably less than 60 microns in width, and optionally etched, is preferred. There is the advantage that substantially all of the surface of an elongate substrate will be available for deposition, and that additional catalytic particles are not required.

Advantageously, an electrically conductive wire is used, and the use of a metallic wire having a diameter of 100-600 microns is preferred. It would normally be provided on a reel in a length of up to, or exceeding 1 km, and may be provided in lengths up to, or exceeding, 5 km or even 10 km, enabling many hours or days of continuous production. The wire is preferably formed of steel, iron or nickel or alloys thereof, but it may comprise other commercially available alloy wires such as, for example, ones containing any one or more of iron, nickel, cobalt and copper.

In a particularly advantageous embodiment, the wire is heated by the passage of an electric current therethrough. This heating method is preferred over conventional furnace heating as it allows uniform heating over a greater length, hence increasing deposition lengths and hence, reproducibility. A direct current will usually be used and should be selected to be sufficient to heat the wire to a suitable temperature for the deposition process to occur, normally between 500° C. and 700° C. Further control over the wire temperature may be achieved in different deposition chambers by the addition of gases with selected different thermal conductivities.

A wire diameter of 200-500 microns is preferred where the wire is to be electrically heated. Usually, the wire will be in continuous electrical contact with one or more liquid metal electrodes to form an electrical circuit, so as to allow movement of the wire before, during or after deposition. Typically, the current is transferred to and from the wire by mercury or mercury amalgam electrodes.

Prior to deposition, the substrate may be subjected to an etching treatment. That stage may remove any surface oxide layer and may involve passing hydrogen over the substrate, optionally together with a low thermal conductivity gas to achieve a desired substrate temperature. That stage may further involve etching surface irregularities on the substrate surface, for example of the order of 10-100 nm, selected depending on the nanostructures required. A reactive gas such as HCl may be used for this purpose.

The resulting nanocarbon "layer" will in fact comprise discrete structures growing next to one another and surface coverage of the elongate substrate may range from say 10-80%, depending on dwell time, temperature etc.

The deposited nanocarbons are usually removed from the substrate in a further continuous or semi-continuous step. A removal device may be mounted adjacent to or on the continuous, elongate substrate and may be provided with one or more blades or flanges; the device may be stationary or movably mounted. A receptacle for collecting the removed material may be provided at the bottom of the deposition chamber. Where the substrate is electrically heated by contact with two electrodes, the removal device will usually be located upstream of the second electrode.

The nanocarbons may be removed from the elongate substrate by relative movement of the coated substrate through an orifice or channel having a marginally larger cross-section than the substrate. These may comprise a bore disposed in a stationary housing through which the substrate moves, or alternatively, may comprise a shaped ring, or half-ring that, in use, passes over a section of the coated substrate to remove the nanocarbons.

The present method has the advantage of making possible continuous operation on a fresh catalyst surface.

Alternatively, the present process may use a recycled substrate. The substrate from which the nanotubes have been removed may be cleaned in a subsequent, continuous or semi-continuous step, and may be optionally returned to apparatus at the start of the process for re-use. Usually, such cleaning will merely involve heating the substrate to around 600° C. in air.

In one preferred aspect of the present invention there is provided a process for forming nanocarbons, in which the nanocarbons are grown on a continuous, elongate, substrate to form a substrate coated along its length with discrete nanocarbon structures, the process involving movement of the substrate through one or more deposition chambers. The nanocarbons will normally be deposited by chemical vapour deposition; the latter could be plasma assisted but is advantageously plasma-free thermal CVD (occurring at or about atmospheric pressure).

In a further important aspect of the present invention there is provided a process for forming nanocarbons, in which the nanocarbons are grown on a conductive, elongate substrate to form a coated substrate, wherein the substrate is heated by passing an electric current therethrough. The nanocarbons will normally be deposited by chemical vapour deposition; the latter may be plasma assisted, although lower reaction kinetics at the lower pressure makes this less preferred.

Electrical heating has the advantage that it can be carefully controlled, depending on the current and wire thickness selected, and provides a uniformly heated substrate. Longer deposition lengths and higher reproducibility is therefore attainable. Thus, d.c. heating of a wire substrate can provide an effective reactor length of several meters, which would not be realisable by passing the wire through a furnace or using RF/plasma CVD, and results in improved production rates and uniformity of product.

The substrate is preferably heated prior to, and/or during deposition, using a direct current, either for a selected time or continuously. The elongate substrate may be in the form of a foil, filament, wire, ribbon, or tape, although an electrically conductive wire is preferred. Ideally, the wire is selected from a steel, iron or nickel wire, with iron being preferred.

The substrate will need to be heated to a suitable temperature for nanocarbon growth to take place by chemical vapour deposition, the temperature preferably being between 500° C. and 700° C. The reaction time and temperature may be adjusted (e.g. by variation of the wire exposed length/speed, and, if electrically heated, by variation of the cross-section and current) by routine experimentation so as to obtain the desired types of nanostructures. The present process is especially suited to generation of MWNTs and GNFs, which tend to need lower temperatures and longer dwell times than SWNTs.

The present invention further provides apparatus for use in a process for forming nanocarbons, in which a nanocarbon layer is grown on a continuous, heated catalytic wire substrate using chemical vapour deposition to form a coated substrate, the process involving:

heating the wire substrate by passing an electric current therethrough via at least two electrodes;

passing the substrate through at least one deposition chamber containing gases which on contact with the hot wire deposit nanocarbons; and, using removal means to remove the deposited nanocarbon layer, the second electrode preferably being positioned downstream of the removal means.

The apparatus comprises a reactor having at least one deposition chamber, supply means for supplying gases to the deposition chamber, support means for transferring the substrate wire through the deposition chamber, at least two electrodes for supplying the heating current to the wire substrate, and removal means for removing the deposited nanocarbon layer.

The second electrode may be disposed in the reactor downstream of the removal means.

The wire substrate may be caused to pass through removal means in the form of an orifice having a marginally larger cross-section than the substrate. The apparatus may further comprise recycling means for cleaning the wire substrate and guiding it back to the upstream end of the deposition chamber.

Additionally, the present invention provides nanocarbons, or a nanocarbon-coated substrate, obtained or obtainable by means of any of the above processes.

Preferred methods and apparatus for preparing nanocarbons in accordance with the present invention will now be described, by way of example only, with reference to the accompanying drawings in which:

FIGS. 1a to 1c are respective schematic views of a single-walled carbon nanotube (SWNT), multi-walled nanotube (MWNT), and graphite nanofibre (GNF);

FIG. 2 is a schematic sectional view of an apparatus for producing carbon nanotubes according to the present invention;

Figure 3:
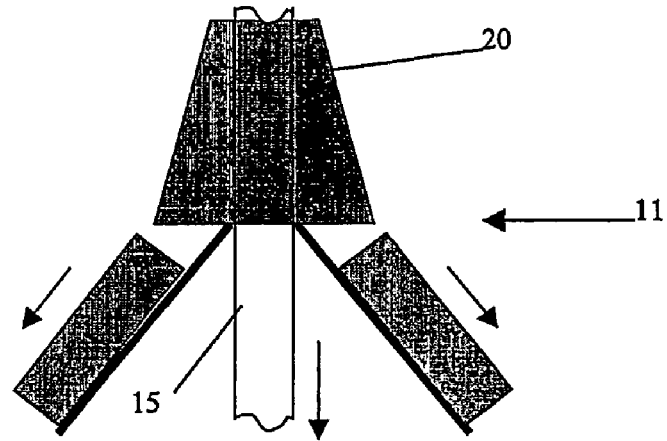
FIG. 3 is an enlarged schematic sectional view of the conical removal device shown in FIG. 2.

Referring to FIG. 2, this shows a preferred apparatus for producing carbon nanostructures using chemical vapour deposition upon a catalytic wire substrate.

The reactor 1 consists of two cylindrical glass tubes mounted vertically above one another to form an upper, etching chamber 2 and lower, deposition chamber 3. The tubes preferably have a combined length in the range 0.5 m to 4 m, preferably 1 to 2 m. At the top of the reactor 1 is a rotatable spool 4 upon which the catalytic wire is stored, and from which, in use, it is dispensed downwardly into the etching chamber and then into the deposition chamber. Below the spool 4, the top of the etching chamber 2 is sealed by an electrode 5 including a central receptacle of liquid mercury or mercury amalgam provided, at the bottom of the liquid pool, with a small central 30 hole through which the wire may pass. The hole is large enough to admit a metallic wire but small enough to retain the liquid metal. Other suitable liquid metals, or mixtures thereof, may also be used such as, for example, mercury/indium, mercury/cadmium or gallium/indium.

Near the top and bottom ends of the etching chamber 2, respectively, an inlet 6 and outlet 7 are provided through which gaseous reactants can enter and leave the etching chamber, preferably in a downward direction. Separating the upper and lower chambers is a gas seal 8 positioned between the glass tubes and also provided with a central bore.

The deposition chamber 3 again has an inlet 9 and outlet 10, one at each of its respective ends for supply and removal of gaseous reactants, preferably in an upward direction as indicated by the arrows.

The bottom of the deposition chamber 3 widens out into a collection chamber 13 containing a removal device 11 and collection receptacle (not shown). Referring to FIG. 3, the removal device is in the form of a truncated cone arranged centrally in the chamber with its hole uppermost. The bottom of the deposition chamber 3 is sealed by a second electrode 12, and beneath that is a further spool 14 attached to a variable speed motor (not shown).

EXAMPLE 1

In a preferred method for continuously producing carbon nanotubes using the apparatus of FIG. 2, a steel or iron wire 15, typically 200-500 microns in diameter, is spooled continuously down through reactor 1. As the wire 15 enters and leaves the reactor 1 it is in electrical contact with the central mercury/mercury amalgam electrodes. The wire 15 and the two electrodes 5 and 12 thus form part of a continuous electric circuit. The direct current supplied is sufficient to heat the wire to a suitable temperature for the deposition process to occur, which temperature will usually be between 500 and 700° C., and may be selected having regard to the type of nanocarbons required.

The spooling rate, and hence, dwell time should be selected having regard to the length of reactor involved and the type of structures required, but is likely to be between 1-6 cm/min, preferably 3-5 cm/min; typical dwell times achieved would be between 20-60 minutes, in particular, 30-40 minutes.

The wire enters the etching chamber 2 at the top of the reactor 1. Hydrogen is introduced into the chamber via inlet 6 to remove any surface oxide layer. Additionally, argon, or some other low thermal conductivity gas, may be added to modify the wire temperature. Additionally, a reactive gas may be added further to etch the surface and produce irregularities suitable for the growth of particular carbon nanostructures. In this case, irregularities of dimensions 10-100 nm on the surface of the wire are introduced by the addition of hydrogen chloride through inlet 6.

As the wire 15 enters the deposition chamber 3, nanotube growth 20 is initiated and a thicker deposit is formed as the wire 15 passes through the chamber 3. Growth is enabled by addition of suitable gases entering via the inlet 9, preferably a combination of hydrogen, carbon monoxide and a hydrocarbon, usually in a diluent such as argon or nitrogen. For the growth of graphite nanofibres, this combination is preferably a mixture of hydrogen and carbon monoxide and the substrate wire is iron. During deposition, it is preferable to maintain a temperature between 550-750° C. and a ratio of $CO:H_2$ between 6:1 and 2:1.

On leaving the lower end of the second chamber 3 the wire 15 passes through a removal device 11. The removal device 11, as shown in FIG. 3, comprises a cone with a small hole at its apex, through which the wire 15 passes causing the nanotubes to be scraped from the wire into the awaiting collection receptacle 13 at the base of the apparatus.

Figure 4:
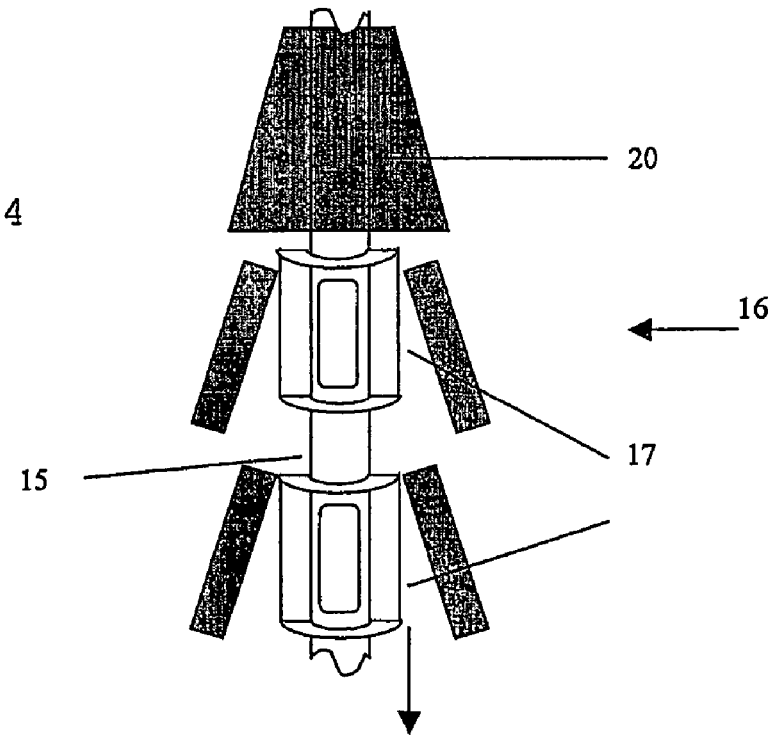
FIG. 4 is a schematic sectional view of an alternative removal device.

Alternative arrangements can also be employed for mechanically removing the growing nanomaterial. FIG. 4 illustrates such an arrangement in which the removal device 16 consists of one or more rings or half-rings 17 mounted on or adjacent to the wire; these may be stationary or may rotate around the wire to scrape off the nanomaterial. Another arrangement (not shown) uses a spiral to remove the nanotubes as the wire 15 passes through it.

By selecting an appropriate length for the deposition chamber, and controlling the speed at which the wire 15 travels through the reactor 1, the rate of nanotube production can be readily adjusted. The resultant nanotubes have a reproducible microstructure. In particular, the use of electrical heating to heat the wire ensures the wire is uniformly and controllably heated, allowing much longer deposition lengths than would be possible in a conventional single furnace system.

An additional stage (not shown) may be provided to remove any remaining carbon from the wire 15, once it has passed out of the reactor 1, to enable re-use of the catalyst wire. This may involve ensuring the temperature of the wire 15 is above 600° C. to oxidise any surface carbon. Alternatively, the carbon could be reductively removed by heating in a gaseous mixture of hydrogen and a low thermal conductivity gas such as argon.

In a similar trial conducted upon a smaller scale, a 200 µm diameter iron wire was reeled into a single chamber 50 cm vertical glass tube reactor, where nanocarbon growth took place on a stationary section of the wire, before it was reeled out and replaced by a new section of wire. The dwell time of successive sections of wire in the reactor was about half an hour. The tube was equipped with electrodes at either end made of stainless steel containing ~0.5 cm$^3$ of mercury, the mercury acting as a gas seal and electrical contact to the wire. A current of 2.5 A was passed through the section of wire in an Ar/H$_2$ mixture to reduce surface oxide, and then the current was reduced to 1.9 A and a 80:20 CO:H$_2$ mixture was passed through the tube. Carbon growth was observed on the wire.

Figure 5A:
FIGS. 5a and 5b are a TEM and Raman spectra, respectively, of carbon nanostructures grown on an electrically heated wire according to Example 1.
Figure 5B:
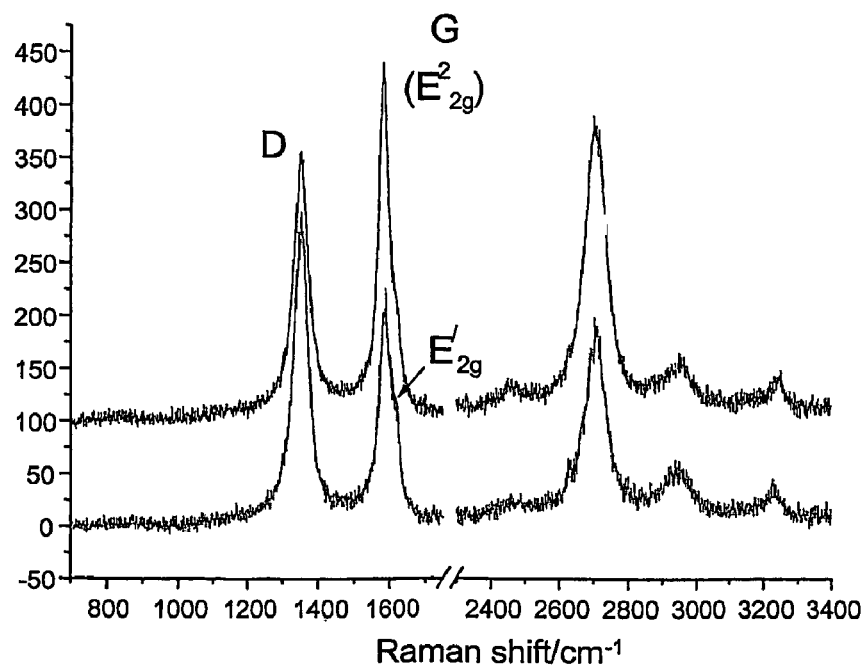

FIG. 5a is a TEM showing a highly graphitic MWNT grown on the electrically heated wire. Significantly, both MWNT's and graphite nanofibres were found to be present and their respective amounts could be varied by varying the processing conditions. FIG. 5b shows two Raman spectra of the material grown on the wire and it can be seen from the narrow width of the Raman lines indicated that the carbon is highly graphitic. The upper trace is typical of MWNTs similar to that shown in FIG. 5a. The lower trace has a higher intensity "D" peak, consistent with the formation of graphite nanofibres.

The invention may be embodied in other forms without departing from the essential characteristics thereof. As indicated above, the apparatus could be modified to omit the etching chamber, and in certain circumstances the separate etching stage could be dispensed with. Moreover, the deposition though described preferentially for an iron or steel wire, is equally applicable to nickel, cobalt and copper wire or any suitable alloy, and can be extended to ribbon, tape or filament.

Furthermore, the process of electrically heating the wire can be replaced by a series of furnaces, which deliver heat evenly across the chambers, and throughout nanotube growth. In that arrangement, normal annular gas seals may replace the electrodes at each end of the reactor.

The following example further illustrates the present invention:

EXAMPLE 2a

Carbon nanotubes were produced by chemical vapour deposition on a 200 micron diameter length of furnace heated iron wire. 0.11 g of the iron wire were introduced to a furnace and etched by heating in H$_2$ to 400° C. for one hour. A mixture of CO and H$_2$ was then passed over the gas and the temperature raised to a temperature where deposition took place. A temperature of between 550-650° C. and a ratio of CO:H$_2$ between 6:1 and 2:1 were found to be preferred. The conditions were maintained for 3.5 hours after which the furnace was cooled and material extracted.

Figure 6A:
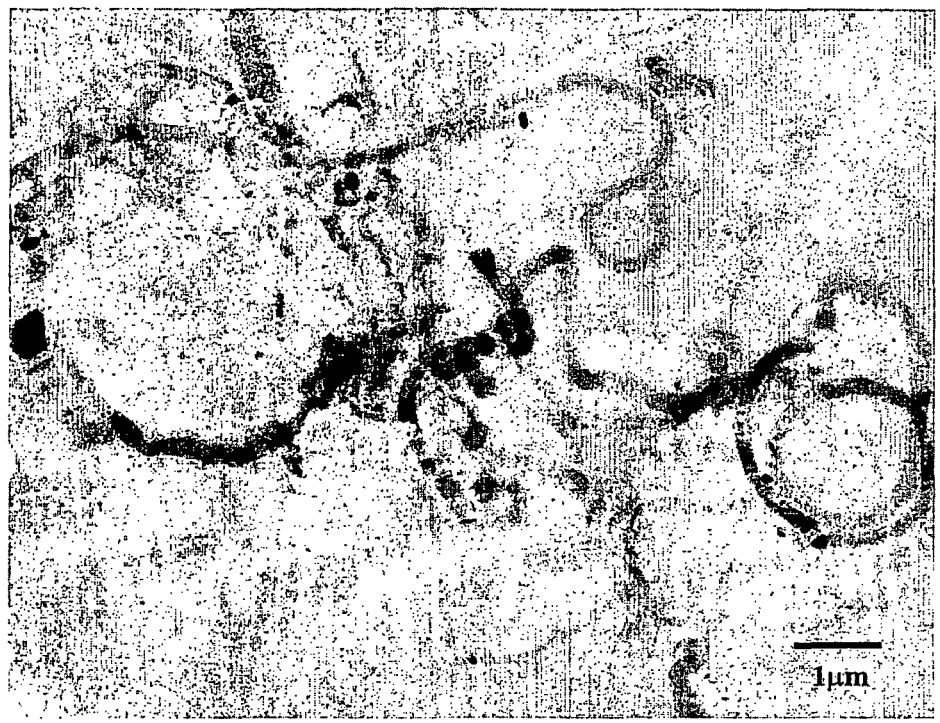
FIGS. 6a and 6b are a TEM and Raman spectrum, respectively, of nanocarbon material grown on a furnace heated wire as described in Example 2a below; and, FIG. 6c is a TEM for nanomaterial grown similarly in Example 2b.
Figure 6B:
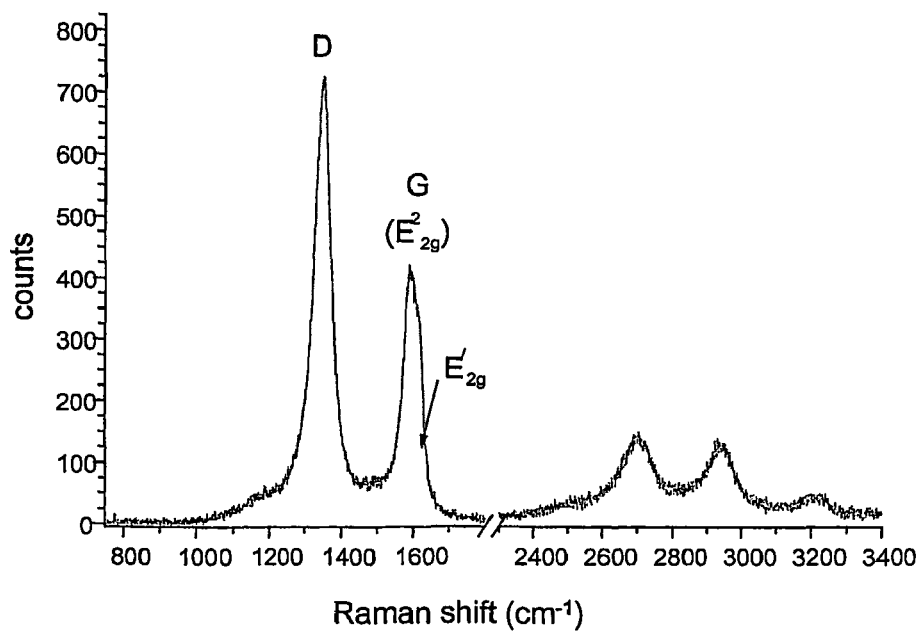

1.62 g of carbonaceous material were produced. Examination by Transmission Electron Microscopy showed the product to be filamentary nanocarbon structures with diameters ranging between 20-300 nm (see FIG. 6a). Referring to FIG. 6b, the Raman spectrum displayed a high ratio of "D" to "G" peak heights, consistent with the dominant structures being graphite nanofibres.

EXAMPLE 2b

Figure 6C:

In a similar experiment to Example 2a, a 200 µm diameter iron wire was suspended down the axis of a vertical tube furnace. The surface oxide layer was reduced by passing H$_2$ through the furnace at 400° C. A 90:30 CO:H$_2$ mixture was then passed through the furnace at 600° C. Carbon nanostructures were produced on the wire surface. FIG. 6c shows a TEM of a typical resulting structure.

These examples show that carbon nanotubes can be grown directly on a wire having dimensions in the order of 200 µm, although the substrate would normally need to comprise particles of comparable dimensions to the resulting tube diameters, or, to have been treated, for example, by a plasma etch, to introduce surface irregularities of similar dimensions to the resulting tubes. Although the exact mechanism is not understood, it seems that a plasma etch is not required and that the wire surface (e.g. iron wires of 100-600 µm) has or generates inherent surface characteristics that are able to catalyse nanocarbon growth.

The invention claimed is:

1. A process for growing carbon nanostructures, in which the nanostructures are grown on a continuous, elongate, heated catalytic substrate using chemical vapour deposition to form a coated substrate, the process involving movement of the continuous substrate through one or more deposition chambers, wherein the carbon nanostructures are grown in a continuous or semi-continuous manner, and wherein the deposited carbon nanostructures are removed from the substrate in a further continuous or semi-continuous step.

2. A process as claimed in claim 1, wherein the carbon nanostructures are removed from the elongate substrate by relative movement of the coated substrate through an orifice having a marginally larger cross-section than the substrate.

3. A process as claimed in claim 1, wherein the substrate from which the carbon nanostructures have been removed is cleaned in a subsequent, continuous or semi-continuous step, and is returned to apparatus at the start of the process for re-use.

4. A process as claimed in claim 1, wherein the substrate is heated to a suitable temperature for nanocarbon growth to take place by chemical vapour deposition, the temperature being between 500° C. and 700° C.

5. A process as claimed in claim 1, wherein the substrate inherently acts as a catalytic substrate without an additional catalytic film or coating.

6. A process as claimed in claim 1, wherein the substrate moves through the one or more deposition chambers in one direction along its own length.

7. A process as claimed in claim 1, wherein the process is conducted at atmospheric pressure and is not plasma-assisted.

8. A process as claimed in claim 1, wherein the continuous, elongate substrate is in the form of a filament, wire, ribbon, or tape.

9. A process as claimed in claim 8, wherein the substrate is an electrically conductive wire.

10. A process as claimed in claim 9, wherein the wire is formed from steel, iron, nickel or alloys thereof.

11. A process as claimed in claim 9, wherein the wire is heated by the passage of an electric current therethrough.

12. A process as claimed in claim 11, wherein the wire is in continuous electrical contact with one or more liquid metal electrodes to form an electrical circuit, so as to allow movement of the wire before, during or after deposition.

13. A process for growing carbon nanostructures, in which the nanostructures are grown on a continuous, heated catalytic wire substrate, in a continuous or semi-continuous manner, using chemical vapour deposition to form a coated substrate, the process involving:
  heating the wire substrate by passing an electric current therethrough via at least two electrodes;
  passing the heated wire substrate through at least one deposition chamber containing gases which on contact with the heated wire substrate deposit nanostructures; and,
  using removal means, in a further continuous or semi-continuous step, to remove the deposited nanostructures, the second electrode being positioned downstream of the removal means.

14. Apparatus for use in a process as claimed in claim 13, comprising a reactor having at least one deposition chamber, supply means for supplying gases to the deposition chamber, support means for transferring the wire substrate through the deposition chamber, at least two electrodes for supplying the heating current to the wire substrate, and removal means for removing the deposited nanostructures, wherein the second electrode is disposed in the reactor downstream of the removal means.

15. Apparatus as claimed in claim 14, wherein the wire substrate is caused to pass through removal means in the form of an orifice having a marginally larger cross-section than the wire substrate.

16. Apparatus as claimed in claim 14, further comprising recycling means for cleaning the wire substrate and guiding it back to the upstream end of the deposition chamber.

\* \* \* \* \*